United States Patent [19]

David

[11] 4,072,234

[45] Feb. 7, 1978

[54] LOCATION OF CARD FRAME GUIDE MEMBERS

[75] Inventor: James Earle David, Stroud, England

[73] Assignee: Critchley Bros. Limited, England

[21] Appl. No.: 684,845

[22] Filed: May 10, 1976

[30] Foreign Application Priority Data

May 8, 1975 United Kingdom ............... 19350/75

[51] Int. Cl.² .............................................. A47F 7/00
[52] U.S. Cl. ....................................... 211/41; 361/415
[58] Field of Search .................. 317/101 DH; 211/41; 361/415, 399; 339/65 M

[56] References Cited

U.S. PATENT DOCUMENTS

| | | | |
|---|---|---|---|
| 3,838,777 | 10/1974 | Thornkroft et al. | 317/101 DH |
| 3,939,382 | 2/1976 | Lucan et al. | 317/101 DH |

Primary Examiner—David Smith, Jr.

Attorney, Agent, or Firm—Young & Thompson

[57] ABSTRACT

Guide members and support members are provided for a frame construction of the type where the guide members are arranged to lie transversely between a pair of spaced, parallel, elongated support members and are provided with locating means at each end to cooperate with corresponding means on each of the support members, and with a slot to receive an edge of a board. Each support member is provided with a rib formation, and the end of each guide member has a corresponding groove formation, formed to provide a snap-on connection onto a rib on a support member. Complementary locating formations are provided at spaced positions along the rib formation and in each groove formation to prevent relative movement between the rib and groove formations in the longitudinal direction of the rib formation.

11 Claims, 12 Drawing Figures

LOCATION OF CARD FRAME GUIDE MEMBERS

This invention relates to frame constructions as used for holding printed circuit boards or other generally flat plate-like electrical components.

The invention is concerned particularly with the construction of guide members and support members for a frame construction of the type comprising two or more elongated parallel spaced support members, and a plurality of transverse guide members each with a groove or slot to receive an edge of one of the printed circuit boards, and having locating means at each opposite end thereof to cooperate with corresponding means on each of the support members, so as to provide support for the guide member. Such frame constructions will be referred to for convenience herein as "frame constructions of the type specified."

It is an object of the present invention to provide a means for locating the guide members positively with respect to the support members.

Accordingly this invention provides guide members and support members for a frame construction of the type specified wherein the support members are each provided with a rib formation, and each end of each guide member has a corresponding groove formation, formed to provide a snap-on connection onto a rib on a support member, and wherein complementary locating formations are provided at spaced positions along the rib formation and in each groove formation to prevent relative movement between the rib and groove formations in the longitudinal direction of the rib formation.

In one embodiment each locating formation comprises, respectively, a recess in the rib formation and a projection in and extending from the groove formation for location within the recess. Ideally, in this case, each recess and projection is of part circular cross-section, up to semi-circular cross-section.

As an alternative embodiment, each locating formation comprises, respectively, a boss projecting from the rib formation directly towards the guide member and a corresponding recess extending into the body of the guide member. In this case each boss and recess may be of part spherical cross-section, up to hemispherical cross-section, or of cylindrical cross-section.

The locating formations need not necessarily be of curved formation although this will usually provide the easiest method of manufacture. Thus the locating formations could, for instance, be square shaped or V-shaped in cross-section.

By designing the support member so as to be symmetrical about vertical and/or horizontal planes the guide members can be positioned in various alternative attitudes and positions. Ideally, the support members and guide members are so designed that the guide members can be located on the support members in a normal or an inverted state so that printed circuit boards can be supported in alternative positions relative to the support members. When the printed circuit boards are to be positioned at two different levels it is convenient that the guide members should be assembled so that the guide members in a row are alternately inverted or upright. Alternatively guide members having a circuit board receiving groove or slot provided in two mutually opposite edges of the guide member, may be employed.

Each support member may be formed with a similar rib along two opposite sides thereof as the locating means. This allows a common extrusion to be used for the support members both at the front and rear of a frame and at different levels therein. Ideally, also the cooperating groove and rib formations will be of undercut profile in cross-section, the rib formation having enlarged heads and the grooves having undercut lateral enlargements, to prevent unintentional withdrawal.

The guide members are preferably formed at least partly of a somewhat resilient material such as a synthetic plastic.

The invention may be performed in various ways and preferred embodiments thereof will now be described, by way of example, with reference to the accompanying drawings, in which.

Figure 1:
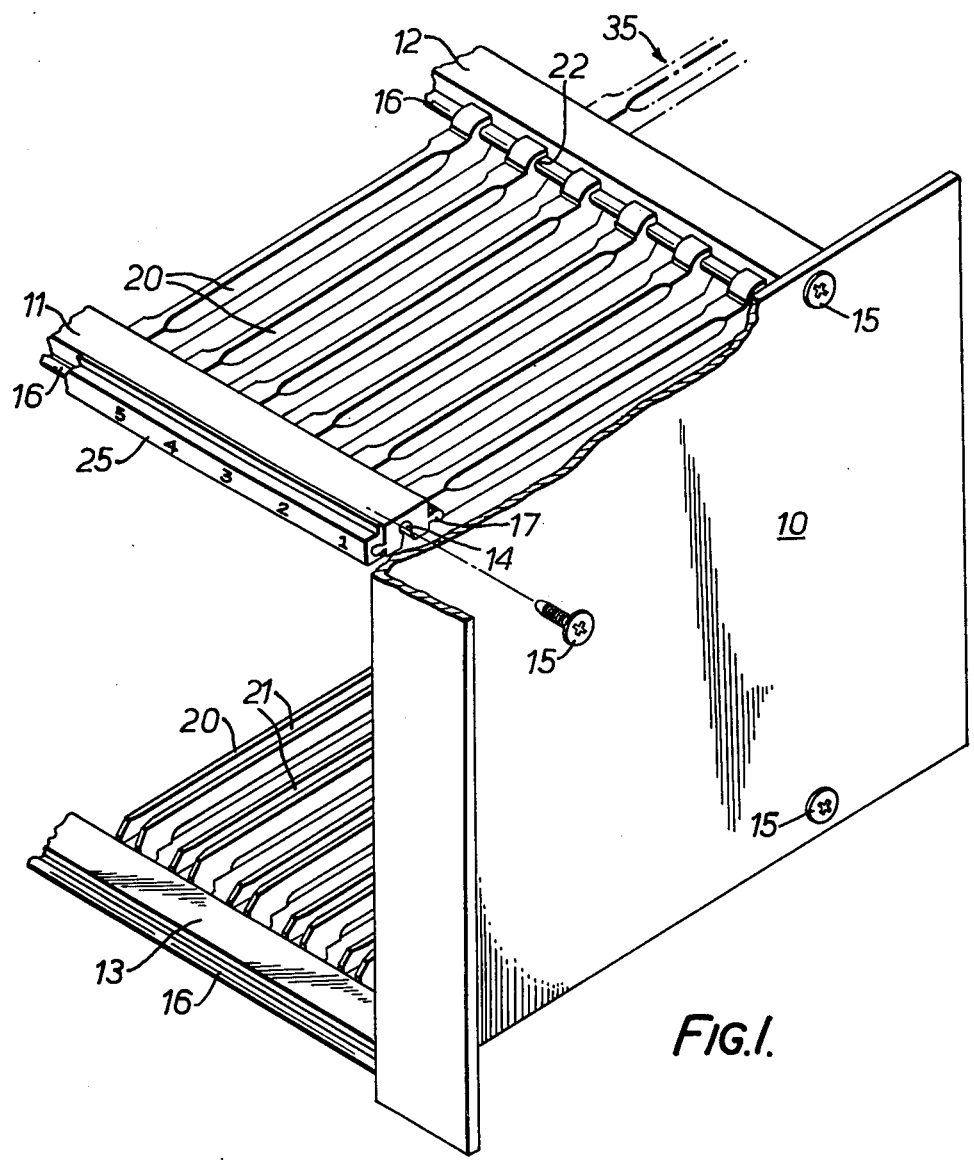
FIG. 1 is a general perspective view of part of a frame construction incorporating guide and support members according to the invention.

Referring first to FIG. 1, the frame construction there shown comprises a pair of end plates, one only of which is illustrated at 10, formed for example of a synthetic plastics material or sheet metal. Between these end plates extend four or more parallel support rails, two of the rails 11,12 being at an upper level and two like rails (only one of which is visible, at 13) positioned at a lower level. Each rail is an aluminium alloy or synthetic plastics extrusion and has a part-circular open groove 14 opening into its under surface to receive a fixing screw 15 driven into the groove through a hole in the respective end plate. A pair of ribs or beads 16,17 extend from each opposite vertical side face of each support rail. All the support rails have exactly the same cross-section and can therefore be formed by a common extrusion process.

Positioned on and between each pair of support rails (e.g. 11 and 12) at the upper and lower levels is a row of guide members or bars 20, formed of plastics material, each having a groove 21 in its downwardly or upwardly facing surface as the case may be. At each end the guide bar has a transverse slot or groove 22 with a slightly restricted entry mouth 23 formed with inclined flanks.

Figure 3:
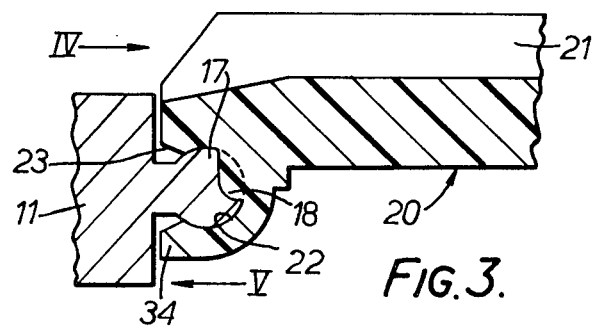
FIG. 3 is a cross-sectional view through an interconnected support member and guide member of a frame construction of FIGS. 1 or 2, illustrating the locating formations of this invention.
Figures 4, 5:
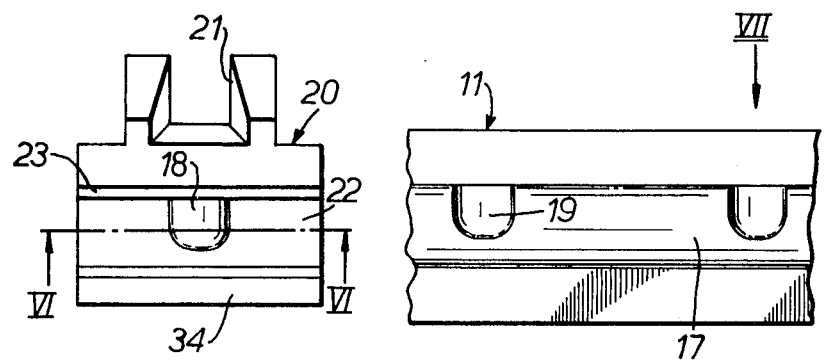
FIG. 4 is an end view of a guide member in the direction of the arrow IV of FIG. 3.
FIG. 5 is a side view of a support member in the direction of arrow V of FIG. 3.
Figure 6:
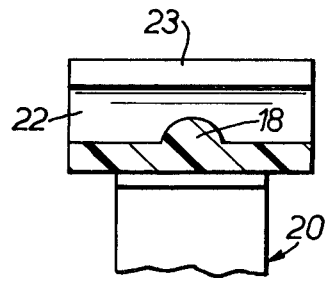
FIG. 6 is a cross-sectional view on the line VI — VI of FIG. 4.
Figure 7:
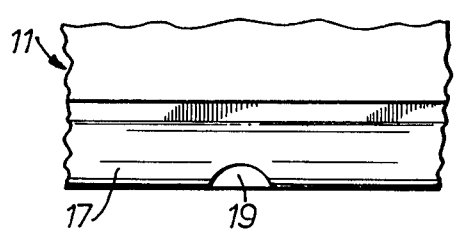
FIG. 7 is a plan view in the direction of arrow VII in FIG. 5.

Each of these grooves is designed to fit onto one of the ribs or beads 16,17 on a support rail as clearly seen in FIG. 3. Since the mouth 23 is slightly restricted the groove interlocks with the enlarged head on the bead and the resilience of the plastics material produces a snap-on effect so that the guide bar can be introduced into position transversely, while any unintentional withdrawal is prevented or restrained. Also it will be noted that, with this lateral snap-on assembly method, it is the groove 22 on the guide bar 20 which will be deformed on assembly or withdrawal and not the rib 16 or 17, so that adjacent bars already in position will not be affected or accidentally displaced.

As shown in FIG. 1 the guide bars 20, mounted between the pairs of support rails, have their grooves 21 facing towards each other so that each vertically aligned pair of guide bars can receive and locate a printed circuit board (not shown) introduced laterally lengthwise so as to stand vertically. To identify the particular board positions, a resilient plastics identification strip 25 can be slid or snapped on to the bead or rail 16 of the top front support rail 11, so that one identification number will be present opposite each board position. As an alternative to the identification strip 25, although less preferred, there may be provided separate C-Clips, such as conventional cable markers as used in electrical wiring installations.

Figure 2:
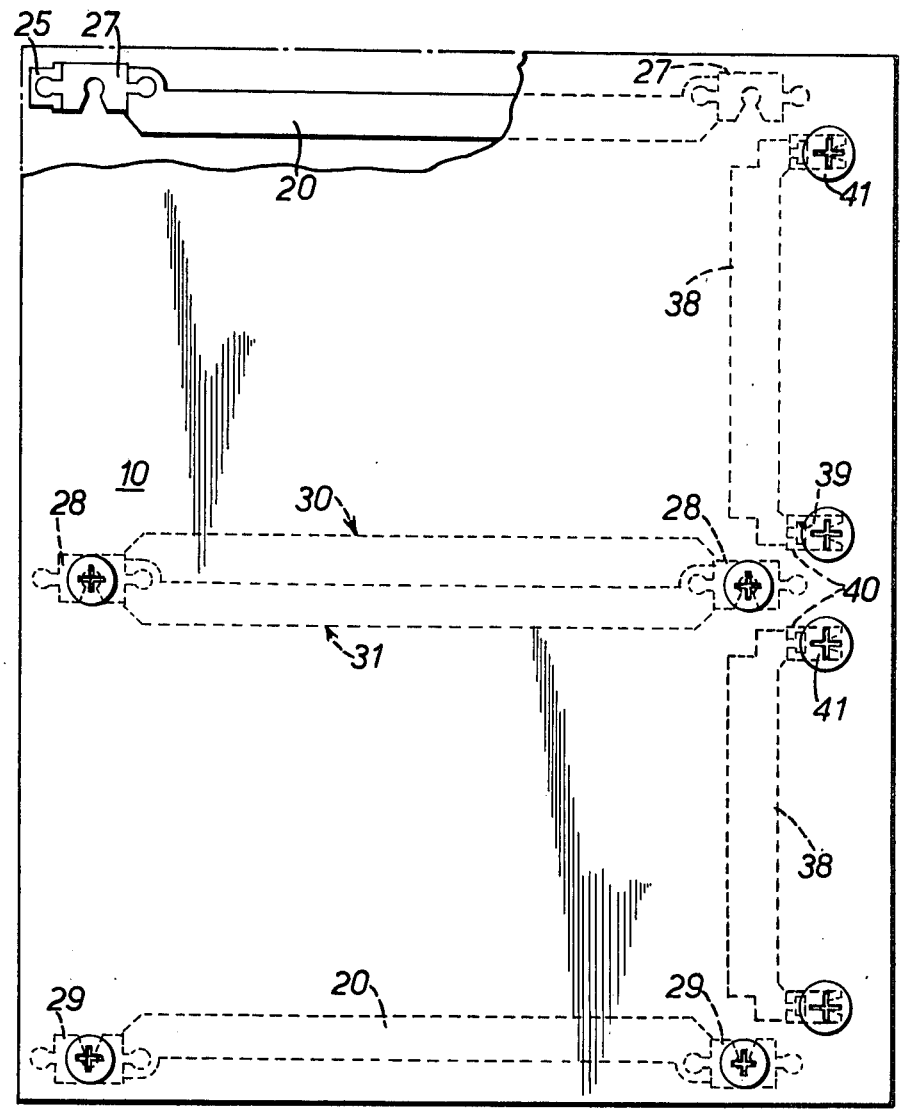
FIG. 2 is an end view of another frame construction arrangement employing guide and support members according to the invention, showing three levels of support rails to provide two vertical banks or tiers of printed circuit boards.

In the FIG. 1 embodiment all the guide bars 20 at the top rail are arranged with their grooves 21 facing downwards, to provide a single horizontal tier or rack for the boards. In some examples, however, the boards may be arranged in two or more vertical levels. For example, as illustrated in FIG. 2 there may be three pairs of support rails 27,28,29 at three different heights. The guide bars 20 at the top level will have their grooves 21 facing downwards and the guide bars 20 at the bottom level will have their grooves 21 facing upwards. At the intermediate level the guide bars are arranged alternately in positions 30 and 31 with their grooves 21 facing upwards and downwards, to cooperate with the guide bars at the top and bottom levels. To permit this alternate arrangement, the cooperating parts of the ribs 16 and 17 and the grooves 22 of each guide member 20 are symmetrical about the horizontal centre line 33, when these parts are interconnected. Thus each guide bar can simply be inverted as required. It is therefore unnecessary to manufacture and supply guide bars of different designs for the different attitudes. Similarly it will be noted that each support rail is symmetrical about a vertical centre line and it follows that the same support rail can be used to form multiple horizontal racks with further guide bars extending horizontally, as illustrated at 35 in FIG. 1. Either bead or rail 16,17 can be used for the identification strip 25. It will be appreciated that where a plurality of horizontal racks are to be formed, the guide bars 20 in the intermediate levels may each be formed with a groove 21 in the top and bottom edge so that it is not necessary to have guide bars with a single groove 21 in alternating positions.

FIG. 2 also shows edge connectors 38 whereby electrical connections may be made to a printed circuit board slid between the guide bars 20. These end connectors are held in place by screws whose heads may be slid into the groove 39 in the support rail 40 which is located by screws 41 through end plates 10.

Whether the guide members 20 are all disposed in one attitude, as in FIG. 1 or in an alternating array, as in FIG. 2, the relative spacings between the guide members is important in order to ensure that the grooves 21 are properly disposed to receive printed circuit boards, modules or other members. Spacing locating arrangements of this invention are shown in FIGS. 3 to 10.

In the construction illustrated in FIGS. 3 to 7, location of the guide member 20, which serves to prevent movement relative to a support member 11 in the longitudinal direction of the support member, is achieved by means of a projection 18 within the groove 22 which locates within a complementary recess 19 in the rib 17 on the support member 11. When the guide member is pushed onto the rib 17, so as to be located thereon, the projection 18 will enter the recess 19 thus providing the desired resistance to longitudinal relative movement. The projection 18 does not extend the full depth of the groove 22 (although it could do if desired) so that the portion 34 is free to flex as it snaps over the rib 17.

The relationship between the projection and recess may be reversed so that, for instance, a dome shaped projection could be formed on the outer surface of the rib 17 which would locate within a complementary concave recess in the base of the groove 22.

Figure 8:
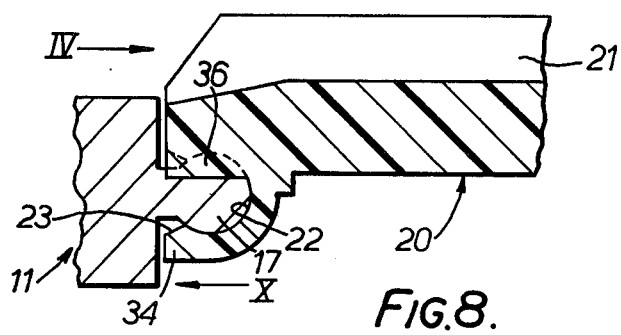
FIG. 8 is a view similar to FIG. 3 of a modified form of locating formation.
Figure 9:
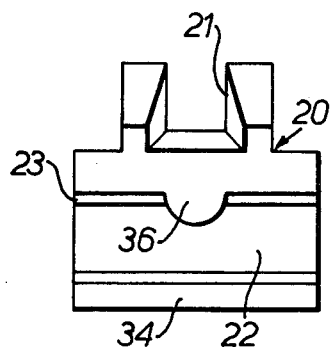
FIG. 9 is an end view of a guide member in the direction of the arrow IX of FIG. 8.
Figure 10:
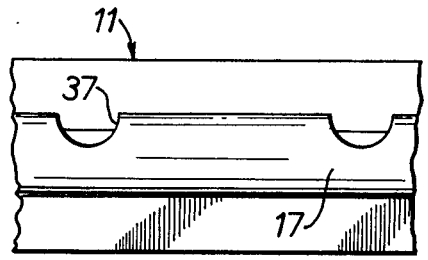
FIG. 10 is a side view of a support member in the direction of the arrow X of FIG. 8.

In the alternative embodiment of FIGS. 8 to 10 a locating projection 36 is formed within the groove 22 of the guide member 20 so as to extend to the outer surface of the member 20. A complementary recess 37 is cut into the top of the rib 17 of the support member 11. With this arrangement, the complementary locating formations 36,37 can be aligned before the groove 22 actually snaps over the rib 17.

Figure 11:
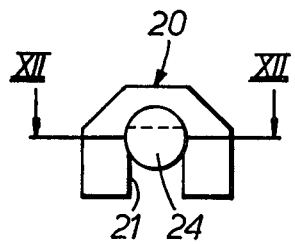
FIG. 11 is an end view of an alternative construction of the other end of the guide member shown in FIG. 3 or FIG. 8.
Figure 12:
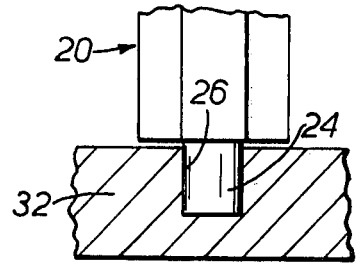
FIG. 12 is a cross-sectional view on line XII — XII also passing through an associated support member.

Ideally both ends of the guide member 20 will be provided with a groove 22 and a locating formation 18 or 36 which will mate with a rib on a support member at each side of the frame. For certain uses, however, an alternative form of location means for the other end of the guide member may be advantageous. One such arrangement is illustrated in FIGS. 11 and 12 and comprises a cylindrical spigot 24 projecting from the end of the guide member 20 which will locate within a complementary recess 26 in a support member 32.

I claim:

1. An assembly of guide members and support members for a frame construction of the type where the guide members are arranged to lie transversely between a pair of spaced, parallel, elongated support members and are provided with locating means at each end to cooperate with corresponding means on each of the support members, and with a slot to receive an edge of a board, wherein the support members are each provided with a longitudinally extending rib formation which, in cross section, is of rounded form carried by and symmetrically of the axis of a neck portion, and the end of each guide member defines a correspondingly rounded groove formation provided, in cross section, by a pair of flexible arms whose free ends extend towards one another and thus towards the neck portion of the support member so as to create a snap-on connection onto the rounded rib formation of the support member, and wherein complementary locating formations are provided at spaced positions along the rib formation and in each groove formation to prevent relative movement between the rib and groove formations in the longitudinal direction of the rib formation, each locating formation comprising, respectively, a recess defined in the rib formation and opening to one side only of said axis of symmetry of the neck portion and the rib formation and being at least mostly disposed in the part of the rib formation on said one side of said axis of symmetry, and a complementary projection within and extending from the groove formation and disposed at least mostly on said one side of said axis of symmetry, whereby the arms are enabled to flex relative to one another and grip the rib formation even in conditions wherein the locating formations have not already interconnected during assembly operations.

2. An assembly according to claim 1, wherein each recess and projection is of part circular cross-section, up to semi-circular cross-section.

3. An assembly according to claim 1, wherein each locating formation comprises, respectively, a boss projecting from the rib formation directly towards the guide member and a corresponding recess defined so as to extend into the body of the guide member.

4. An assembly according to claim 1, wherein each projection and recess is of part spherical cross-section, up to hemispherical cross-section.

5. An assembly according to claim 1, wherein the support member is symmetrical about the vertical plane.

6. An assembly according to claim 1, wherein the locating formations are disposed in a direction parallel with the length of the associated guide member.

7. An assembly according to claim 1, wherein the locating formations are disposed in a direction normal to the length of the associated guide member.

8. An assembly according to claim 1, wherein the support members and guide members are so designed that the guide members can be located on the support members in a normal or an inverted state.

9. An assembly according to claim 8, having guide members assembled in a row on the support members so that the guide members are alternatively inverted or upright.

10. An assembly according to claim 1, wherein the guide members have an upper edge and a lower edge and a circuit board receiving groove or slot is defined in each of the two edges of the guide member.

11. An assembly according to claim 1, wherein the guide member has two ends and one end of the guide member defines a groove for location over a rib on one support member, and the other end of the guide member is formed with a spigot to locate within a hole defined in another support member.

* * * * *